United States Patent

Niikura

Patent Number: 5,700,321
Date of Patent: Dec. 23, 1997

[54] METHOD OF FEEDING A DOPANT IN A CONTINUOUSLY CHARGING METHOD

[75] Inventor: Keishi Niikura, Hiratsuka, Japan

[73] Assignee: Komatsu Electronic Metals Co., Ltd., Kanagawa, Japan

[21] Appl. No.: 687,690

[22] Filed: Jul. 26, 1996

[51] Int. Cl.⁶ .................................................. C30B 15/04
[52] U.S. Cl. ............................ 117/19; 117/18; 117/912
[58] Field of Search ................................. 117/2, 13, 18, 117/19, 200, 900, 912; 427/1

[56] References Cited

U.S. PATENT DOCUMENTS

| | | | |
|---|---|---|---|
| 2,892,739 | 6/1959 | Rusler | 117/19 |
| 5,242,531 | 9/1993 | Klingshirn et al. | 117/21 |
| 5,360,480 | 11/1994 | Altekrüger | 117/214 |
| 5,427,056 | 6/1995 | Imai et al. | 117/18 |
| 5,488,923 | 2/1996 | Imai et al. | 117/18 |

FOREIGN PATENT DOCUMENTS

| | | | |
|---|---|---|---|
| 3184345A | 8/1991 | Japan | 117/19 |

Primary Examiner—Felisa Garrett
Attorney, Agent, or Firm—Welsh & Katz, Ltd.

[57] ABSTRACT

The object of the present invention affords a method of feeding dopant and a dopant composition used therein for easily preparing single crystals having a desired doping concentration during semiconductor substrate fabrication.

In accordance with the present invention, a water solution containing oxides of the dopant is first added to the liquid containing colloidal silica. The colloidal silica can adsorb the oxides of the dopant to form a dopant composition. Around rod-shaped polysilicon, that is polysilicon rod, the dopant composition is discontinuously coated on the periphery of the polysilicon rods spaced at constant intervals and then dried. When the polysilicon rods are melted in an apparatus for manufacturing single crystals by a heater, dopant is protected by the glassed silica without evaporation. Accordingly, the dopant can be provided at a predetermined concentration to sustain the grown single crystals having a doping concentration as required.

3 Claims, 2 Drawing Sheets

METHOD OF FEEDING A DOPANT IN A CONTINUOUSLY CHARGING METHOD

BACKGROUND OF THE INVENTION

1. Field of the Invention

The present invention generally relates to the technique for preparing single crystals for use as semiconductor substrates. More particularly, the present invention relates to a method of feeding dopant in the continuously-charged method and a dopant composition used thereby.

2. Description of the Related Art

At present, most of semiconductor substrates used for fabricating integrated circuits are made of single crystal silicon. However, a substantial percentage of the silicon crystals used by the semiconductor industry are prepared by the Czochralski technique, CZ thereafter. In the CZ crystal-growth process, polycrystalline silicon is first loaded into a crucible, which is placed in the chamber of a manufacturing apparatus, as a raw material. A main heater around the crucible is utilized to heat the polycrystalline silicon so as to melt above its melting point. Moreover, a suitably oriented seed crystal is suspended in the crucible by a seed holder, and thereafter is immersed into the melt. It is then slowly pulled up and rotated in a direction the same as or counter to that of the crucible rotation. Progressive single-crystal growing is performed at the solid-liquid interface.

However, dopant, such as boron, phosphorus, or antimony, is added to the melt so that the grown single crystal obtains a desired conductivity type, either N-type or P-type. For example, a known amount of granular dopant is cast into the melt when a single crystal is manufactured by the CZ method and should be doped into a desired concentration. Moreover both granular polysilicon and dopant are added to the melt by the continuously-charged method during the fabrication of silicon crystals.

The continuously-charged method, which replenishes the crucible with raw material based upon the volume of the grown single crystal, can efficiently prepare large-diameter single crystals of silicon. FIG. 3 schematically depicts an apparatus for preparing single crystals by melting rod-shaped polysilicon as the provision of the raw material for the continuously-charged method in a partially sectional view. As shown in the drawing, a single crystal 4 is pulled out from the central portion of a crucible 3. Two heaters 5 are spaced apart over the crucible 3 and the single crystal 4 is placed therebetween. Rod-shaped polysilicon 1, named as polysilicon rods herebelow, are suspended from the upper portion of a chamber 6 and put in those heaters 5, one by one, so as to melt them down. The polysilicon rods are then melted and drop into the melt 7. After one of the polysilicon rods is completely melted, another polysilicon rod starts to melt, thus continually providing the raw material. Reference numerals 8 designate protection casings, each of which encloses the corresponding heater 5, provided with the bottom portions merged in the melt 7 so as to avoid the vibration propagation caused by the dropping as well as to perform gas phases detachment. Furthermore, reference numeral 9 designates a main heater and reference numeral 10 indicates a heat-preservation barrel. Reference numeral 11 is the shaft of the crucible.

When the continuously-charged method is utilized to prepare the single silicon crystals of either P-type or N-type, both the granular dopant and polysilicon are directly cast into the melt. However, those cast articles may float over the surface of the melt because of insolubility. To solve this problem, dopant-containing polysilicon as raw material can be melted and fed to the melt. In other words, the polysilicon rods used in the continuously-charged method have been doped with the same desired doping concentration as the grown crystal Therefore, by heating the doped polysilicon rods to the melt, single crystals of silicon with the desired and lengthwise uniform doping concentration are achievable. Moreover, a simple and convenient way is utilized to coat a water solution, which contains the oxide of dopant, onto the outer periphery of the polysilicon rods.

However, a portion of the dopant coated onto the polysilicon rods may be vaporized during heating. Accordingly, it is difficult to fabricate single crystals of silicon provided with desired and also uniform doping concentration along the longitudinal length.

SUMMARY OF THE INVENTION

In light of the above-mentioned problems, the present invention proposes a method of feeding dopant for the continuously-charged method and a dopant composition used therein to overcome the drawbacks the conventional method encounters. Consequently, the single crystals of semiconductor prepared by the continuously-charged method display lengthwise uniform desired doping concentration.

Accordingly, the present invention achieves the above-identified object by utilizing a method of providing dopant for use with the continuously-charged method, pulling single crystals out from a crucible which contains melting material of semiconductor and continuously supplying polysilicon, comprising: using colloidal silica as a solvent; adding a water-soluble dopant-containing solute into the solvent to form a solution; and coating the solution onto the polysilicon, thereby feeding the dopant to the melting solution.

Moreover, a method of feeding dopant for continuously-charged method, which makes use of a heater over a crucible to melt polysilicon rods into melting drops flowing into a melt to feed raw material, comprising: using colloidal silica as a solvent; adding water-soluble dopant-containing solute into the solvent to form a solution; and coating the solution at a desired quantity onto the periphery of the polysilicon rods thereby feeding the dopant to the melt. Note that the solution is discontinuously coated onto the periphery of the polysilicon rods spaced by constant intervals.

Furthermore, a dopant composition, in accordance with the present invention, comprises a dopant-containing water-soluble compound adsorbed to colloidal silica Accordingly, the dopant-containing compound adsorbed to the colloidal silica forms the dopant composition, and, therefore, the aforementioned colloidal silica is converted into glass to retard the evaporation of the dopant at high temperature. Accordingly, it is effortless to prepare single crystals with lengthwise uniformity of desired doping concentration. Moreover, the process of discontinuously coating the dopant composition spaced at constant intervals around the periphery of the polysilicon rods can accurately control the doping quantity applied to the polysilicon. Consequently, the production of high-quality single crystals can be obtained.

DETAILED DESCRIPTION OF THE PREFERRED EMBODIMENT

These and other objects, features, and advantages of the present invention will become apparent by way of the following detailed description of the preferred but non-limiting embodiments. In accordance with the present invention, the dopant composition is prepared by the following sequential steps:

(1) Adding silicon powders of high-purity to concentrated ammonia forms a solution, wherein the aforementioned silicon powders turn into colloidal silica Note that the solution thereafter acts as a solvent.

(2) Dopant, such as phosphoric acid or boric acid, is added to the solvent. The concentration of the dopant is based on the requirements of the quantity coated over the polysilicon rods, or the resistance of the grown silicon crystals. Therefore, a solution with a desired concentration of dopant is obtained.

(3) The colloidal silica adsorb dopant-element-containing oxides to form the dopant composition.

Figure 1:
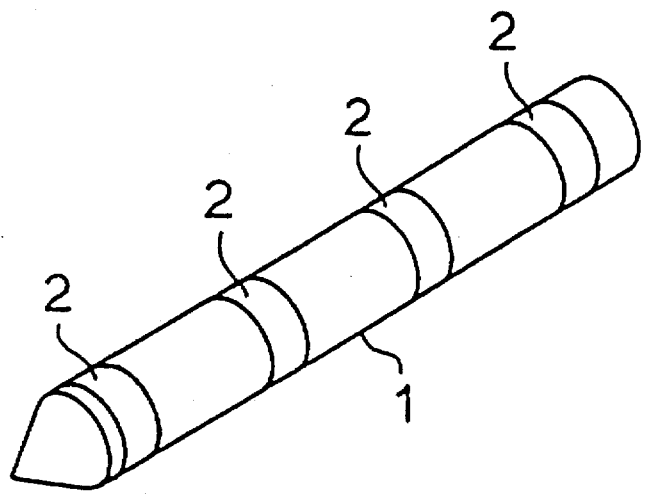
FIG. 1 depicts the positions on which the dopant composition is coated at the outer periphery of the polysilicon rods.

As applied to the continuously-charged method, melting polysilicon rods and causing them to drop into the melt, the dopant composition is first coated on the predetermined peripheral portions of the polysilicon rods 1 with required quantity as depicted in FIG. 1, and fully dried. The numeral references 2 indicate the portions on which the dopant composition is coated. Accordingly, it is effortless to control the coating quantity discontinuously coated on the periphery of the polysilicon rods spaced in a constant interval as compared with being coated on the overall. After that, the coated polysilicon rods 1 are loaded into the apparatus for manufacturing single crystals, by the continuously-charged method, and are melted by the heater in a similar manner to that the conventional method.

While using the continuously-charged method, raw material, polysilicon coated with dopant composition and then dried, is first loaded into the crucible, or, alternatively, predetermined quantities of polysilicon and dopant are loaded into the crucible. Subsequently, those materials are melted into a melt by the main heater. According to the quantity of the grown single crystals, polysilicon rods coated with the aforementioned dopant composition are melted and supply melting drops having the desired concentration into the melt. Alternatively, the polysilicon rods coated with the dopant composition can be directly melted to form the melt.

Figure 2:
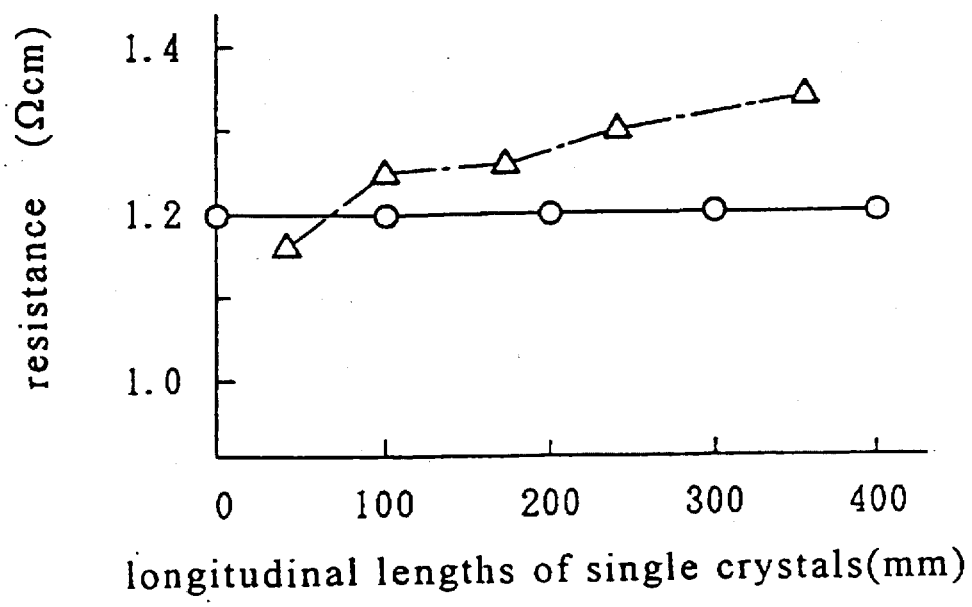
FIG. 2 depicts resistance variation versus the length of the grown single crystals.
Figure 3:
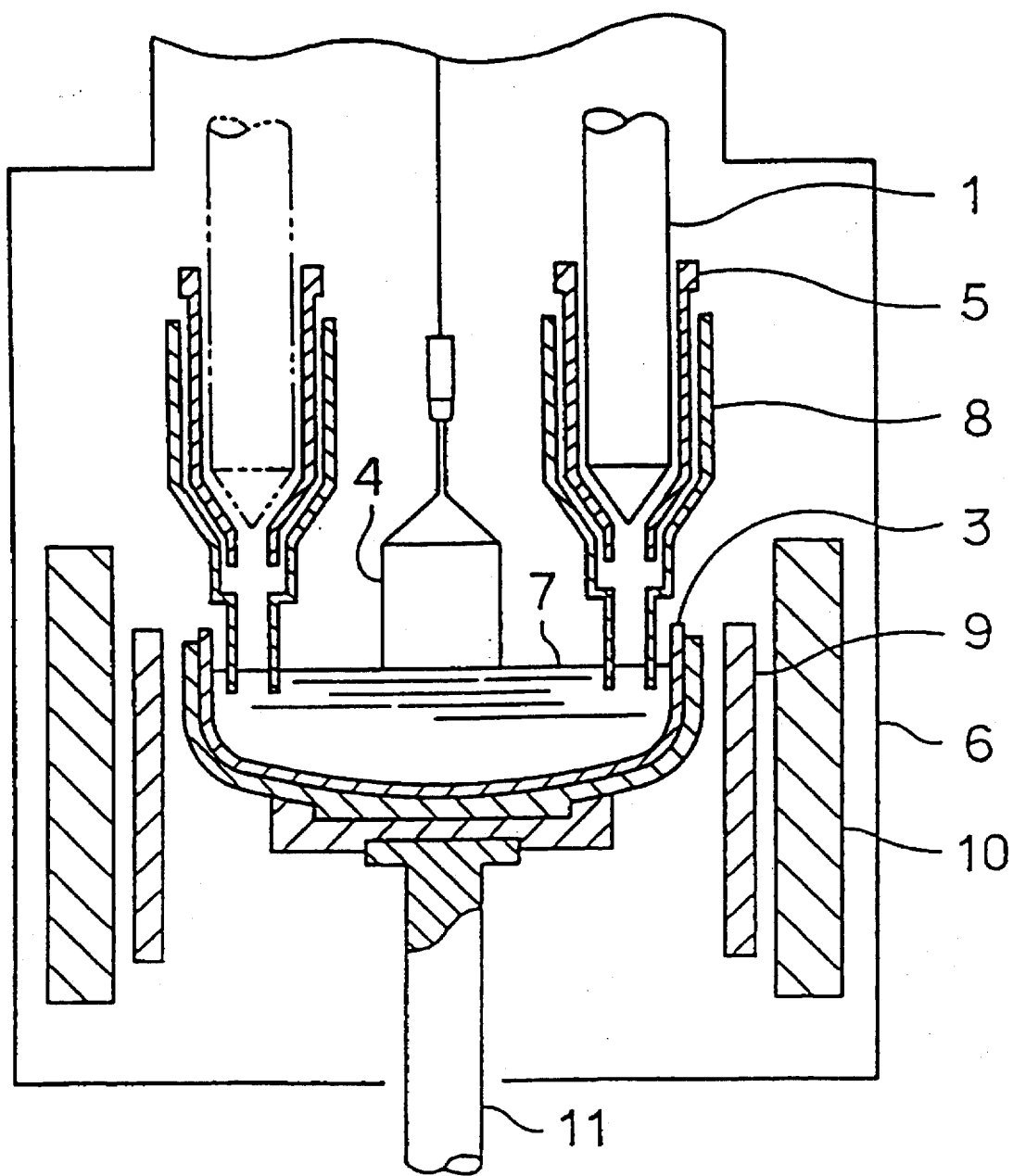
FIG. 3 depicts in partially sectional view an apparatus for manufacturing single crystals by melting polysilicon rods.

FIG. 2 depicts resistance variation versus the length of the single crystals. In the drawing, the curve marked with "o" indicates the result by using the polysilicon rods coated with the dopant composition in accordance with the present invention. Moreover, the curve marked with "Δ" designates the result by merely using water as solvent for comparison.

In accordance with the present invention, because the dopant composition is adsorbed by the colloidal silica, the dopant does not evaporate while melting the polysilicon rods, and thus is fully supplied to the melting solution. Consequently, dopant is more uniformly distributed in the grown single crystals. As depicted in FIG. 2, a single crystal having 400 mm long still sustains the desired resistance 1.2 $\Omega$.cm, uniformly. On the contrary, in the case where merely water is used as the solvent the resistance is proportional to the longitudinal distance along the grown crystal since the dopant is evaporated and diminished in the melt.

However, the method of providing dopant, in accordance with the present invention, is not confined to use in the continuously-charged method. In addition, the method is suitable for the FZ method, the recharged method which utilizes polysilicon rods as raw material, or the continuous CZ method that utilizes granular polysilicon as raw material.

In conclusion, the dopant-containing compound adsorbed to the colloidal silica forms the dopant composition, and, therefore, the aforementioned colloidal silica is converted into glass to retard the evaporation of the dopant at high temperatures. Accordingly, it is effortless to prepare single crystals with lengthwise uniformity of desired doping concentration. Moreover, the process of discontinuously coating the dopant composition spaced at constant intervals around the periphery of the polysilicon rods can accurately control the doping quantity applied to the polysilicon. Consequently, the production of high-quality single crystals can be obtained.

What is claimed is:

1. A method of feeding a dopant for use with a continuously-charged method, pulling single crystals out from a crucible which contains melted semiconductor material and continuously supplying polysilicon, comprising:

using colloidal silica as a solvent;

adding a water-soluble compound containing a dopant-element as a solute into the solvent to form a solution;

coating the solution onto the polysilicon, thereby feeding the dopant to the melting solution.

2. A method of feeding a dopant for use with a continuously-charged method, which makes use of a heater over a crucible to melt polysilicon rods which are then dropped into a melt to feed a raw material, comprising:

using colloidal silica as a solvent;

adding a water-soluble compound containing a dopant-element as a solute into the solvent to form a solution;

coating the solution onto the polysilicon rods so as to feed a required amount of dopant to the melt.

3. The method as claimed in claim 2, wherein the solution is discontinuously coated onto the periphery of the polysilicon rods spaced at constant intervals.

* * * * *